United States Patent
Tanaka et al.

[11] Patent Number: 6,046,926
[45] Date of Patent: Apr. 4, 2000

[54] FERROELECTRIC MEMORY AND SCREENING METHOD THEREFOR

[75] Inventors: Sumio Tanaka, Tokyo; Hiroyuki Takenaka, Kamakura; Mitsuru Shimizu, Kawasaki, all of Japan

[73] Assignee: Kabushiki Kaisha Toshiba, Kawasaki, Japan

[21] Appl. No.: 09/170,104

[22] Filed: Oct. 13, 1998

[30] Foreign Application Priority Data

Oct. 15, 1997 [JP] Japan .................................. 9-299402

[51] Int. Cl.$^7$ .................................................. G11C 11/22

[52] U.S. Cl. .......................... 365/145; 365/65; 365/201; 365/230.06

[58] Field of Search ............................... 365/145, 65, 149, 365/230.03, 230.06, 201

[56] References Cited

U.S. PATENT DOCUMENTS

| | | | |
|---|---|---|---|
| 5,075,887 | 12/1991 | Magome et al. | 365/222 |
| 5,229,971 | 7/1993 | Kiryu et al. | 365/230.03 |
| 5,546,342 | 8/1996 | Nakane et al. | 365/198.01 |
| 5,798,964 | 8/1998 | Shimizu et al. | 365/145 |
| 5,901,077 | 5/1999 | Nishimura | 365/145 |
| 5,912,846 | 6/1999 | Taylor | 365/198.05 |

*Primary Examiner*—David Nelms
*Assistant Examiner*—Thong Le

[57] ABSTRACT

A ferroelectric memory has a memory cell screening test circuit connected to bit lines through switching transistors. In screening, at least one word line is selected, and data is simultaneously written in all memory cells connected to this word line. Since data is not restored after the rewrite, all FRAM cells can be screened under the same condition. By this circuit, a memory cell having a write failure according to the imprint characteristics inherent to the ferroelectric memory is screened.

20 Claims, 8 Drawing Sheets

FERROELECTRIC MEMORY AND SCREENING METHOD THEREFOR

BACKGROUND OF THE INVENTION

The present invention relates to a method of screening a write failure associated with imprint characteristics inherent to a ferroelectric memory and, more particularly, to a ferroelectric memory capable of screening all memory cells under the same condition while preventing data to be restored after the rewrite.

In recent years, extensive studies and development have been made for a nonvolatile ferroelectric memory using ferroelectric memory cells as a semiconductor memory device with low power consumption. A semiconductor memory device using ferroelectric memory cells is disclosed in, e.g., U.S. Pat. No. 4,873,664 (Eaton Jr.) or S. S. Eaton Jr. et al., "A Ferroelectric DRAM Cell for High Density NVRAMs", ISSCC Digest of Technical Papers, pp. 130–131, February, 1988. As a system using a ferroelectric memory, an RFID (Radio Frequency IDentification) system is known. This is a non-contact tag system (identification device) using a radio wave and comprises a host side constituted by a personal computer, a controller, an antenna, and the like, and a transponder. A semiconductor chip having a nonvolatile ferroelectric memory is mounted in this transponder.

For the information storage capacitor of a ferroelectric memory cell, a ferroelectric film consisting of barium titanate ($BaTiO_3$), lead titanate zirconate ($Pb(Zr, Ti)O_3$; PZT), lanthanum-doped lead titanate zirconate (($Pb, La)(Zr, Ti)O_3$; PLZT), lithium niobate ($LiNbO_3$), or potassium lithium niobate ($K_3Li_2Nb_5O_{15}$) is used. In these ferroelectric films, polarization occurs upon receiving a voltage. The voltage and polarization have so-called hysteresis characteristics therebetween.

The present inventors measured the characteristics of these ferroelectric films and found that externally applied physical stress influences on the above hysteresis characteristics. More specifically, when physical stress is applied to the ferroelectric film after film formation, the hysteresis loop becomes small to degrade the polarization holding characteristics. The ferroelectric memory holds data using polarization, and the externally applied physical stress obviously causes degradation in data holding characteristics.

FIG. 1 shows part of the arrangement of a memory cell of a conventional ferroelectric memory and a peripheral circuit. A memory cell array (not shown) is formed by integrating a plurality of memory cells 30. A row decoder (word line selection circuit) 40 is shared by the memory cells.

Each of a plurality of word lines WL is commonly connected to a plurality of memory cells on one row. In accordance with an address signal externally input, one of the plurality of word lines is selected by the row decoder 40.

A plate line PL is commonly connected to a plurality of memory cells, like the word line WL. More specifically, the plate line PL is connected to the plate electrodes of capacitors constituting the memory cells and driven by a plate decoder (plate line selection circuit) 38. The plate decoder 38 is formed by connecting a NAND circuit and an inverter in series. A signal obtained by ANDing a word line signal and a plate line control signal is supplied to the plate electrode.

The word line signal or plate line signal is a pulse signal. The pulse width of the plate line signal for controlling the plate line is shorter than that of the word line signal. That is, the plate line signal rises/falls in a short time. For this reason, the speed for reading out information from the memory cell is dominated by the pulse of the plate line signal. To prevent this, the transistor of the plate line selection circuit must be made large to improve the driving capability. However, when the transistor of the inverter is excessively made large, the pitch of the word line driving portion of the row decoder 40 does not coincide with that of the plate line selection circuit. Since the larger one of the word line interval and the plate line interval dominates the other, the waste on chip area increases.

The ferroelectric memory has imprint characteristics. The imprint characteristics result from the following two factors. (1) When the same data is repeatedly read/written, and then, inverse data is to be written, and (2) certain data is written and left to stand. In such cases, the remnant polarization (Pr) of inverse data write is insufficient, and the influence of the previous data remains.

The ferroelectric memory has such characteristics. Therefore, in screening memory cells insufficiently written, the same condition must be reproduced for the cells, and screening takes a long time.

Next, the operation of the ferroelectric memory will be described. Generally, the ferroelectric memory performs almost the same operation as that of a DRAM except that a word line signal is decoded to select a plate line.

First, a row address is received to select a word line. Data stored in each of the memory cells connected to the selected word line flows to the corresponding one of the bit lines to drive the sense amplifier. The sense amplifier senses (amplifies) a very small change in voltage to prepare digitized data.

Subsequently, a column address is received to select a CSL (Column Select Line) corresponding to the address, and data flows to the I/O line. This is the read operation.

In the write operation, the gate of the CSL corresponding to the column address is selected in the read state (after charge/discharge of bit lines) to write data on the I/O line.

Assume that in one cycle, data is sequentially written in memory cells connected to all bit lines corresponding to a certain word line.

First, new data is written in a memory cell selected for the first time. When data is to be written in the second memory cell, the data previously written in the first memory cell is rewritten (restored). This operation is sequentially performed in units of bit lines (in units of cells). In the final memory cell, data is written only once.

That is, in all memory cells other than the final memory cells, data may be restored once or more. In the ferroelectric memory, data can be properly rewritten by writing data certain times regardless of the imprint characteristics. The memory cell in which the data is to be finally written is most largely influenced by the imprint characteristics and therefore is disadvantageous in the write condition.

A screening test is preferably done for all memory cells under the disadvantageous condition. However, a very long time is required to test all memory cells under the same condition as that for the memory cell in which data is to be finally written, i.e., data is written only once, and a predetermined time elapses after the write. Therefore, screening in a short time is required for the ferroelectric memory.

BRIEF SUMMARY OF THE INVENTION

It is an object of the present invention to provide a ferroelectric memory capable of screening all memory cells under the same condition while preventing data to be restored after the rewrite, and a screening method therefor.

In order to achieve the above object, according to the present invention, there is provided a ferroelectric memory comprising:

a memory cell array in which a plurality of memory cells are arrayed in rows and columns, each of the plurality of memory cells including an information storage capacitor and a first MOS transistor, which is connected to the information storage capacitor in series, the information storage capacitor having a first and a second electrode opposing each other and a ferroelectric film sandwiched by the first and the second electrode, the first MOS transistor having first source and drain regions and a first gate electrode, and one of the first source and drain regions being connected to the first electrode of the capacitor;

a plurality of word lines arrayed in correspondence with the rows, each of the plurality of word lines being connected to the first gate electrode of the first MOS transistor of each of the plurality of memory cells arrayed on a corresponding one of the rows;

a row decoder for selectively driving the plurality of word lines;

a plurality of plate lines, each of the plate lines being connected to the second electrode of the capacitor of each of the plurality of memory cells arrayed on a corresponding one of the rows;

a plurality of bit lines arrayed in correspondence with the columns and arranged to cross the plurality of word lines, each of the plurality of bit lines being connected to the other of the first source and drain regions of the first MOS transistor of each of the plurality of memory cells arrayed on a corresponding one of the columns;

a plurality of second MOS transistor for bit line selection, which are coupled to the plurality of bit lines, respectively, each of the second MOS transistors having second source and drain regions and a second gate electrode, and one of the second source and drain regions being connected to a corresponding one of the plurality of bit lines; and a test circuit connected to the second gate electrode of each of the plurality of second MOS transistors to screen the plurality of memory cells.

Preferably, the test circuit for screening the plurality of memory cells comprises a third p-channel type MOS transistor having third source and drain regions, a third gate electrode, and a backgate electrode, a fourth n-channel type MOS transistor having fourth source and drain regions and a fourth gate electrode, and a first and a second external input terminal, one of the third source and drain regions and the backgate electrode are connected to the first external input terminal, the third gate electrode is connected to the second external input terminal, and the other of the third source and drain regions is connected to the second gate electrode of each of the plurality of second transistors, one of the fourth source and drain regions is connected to a ground potential, the fourth electrode is connected to the second external input terminal, and the other of the fourth source and drain regions is connected to the second gate electrode of each of the plurality of second transistors, and the plurality of bit lines form a plurality of bit line pairs each comprising a bit line and a complementary bit line, the bit line and the complementary bit line being connected to a third and a fourth external input terminal for test through corresponding ones of the plurality of second transistors for bit line selection, respectively.

Preferably, a plurality of corresponding plate lines of the plurality of plate lines are arranged for each of the plurality of word lines.

The memory preferably further comprises a plate line decoder having operation of decoding a selection signal for the row decoder and a column address and selectively driving one of the plurality of corresponding plate lines.

The memory cell array is preferably divided into a plurality of blocks, each of the plurality of blocks having the row decoder to selectively drive the plurality of word lines.

Preferably, a plurality of corresponding plate lines of the plurality of plate lines are arranged for each of the plurality of word lines contained in each of the plurality of blocks.

Preferably, the memory further comprises a plate line decoder for each of the blocks, the plate line decoder having an operation of decoding a selection signal for the row decoder for each of the blocks and a column address to selectively drive one of the plurality of plate lines.

Preferably, the memory further comprises a sense amplifier and a column selection gate connected to each of the plurality of bit line pairs, and a test mode selection circuit connected to the first external input terminal of the test circuit, the test mode selection circuit having operation of stopping functions of the sense amplifier and the column selection gate in a test mode.

Preferably, the row decoder is divided into a plurality of row decoder blocks, and the memory further comprises a row decoder block selection circuit for selectively driving the plurality of row decoder blocks.

The row decoder selection circuit may have operation of selecting all of the plurality of row decoder blocks in the test mode.

According to the present invention, there is also provided a method of screening a ferroelectric memory of the present invention, comprising the steps of:

supplying signals to the first and the second external input terminal of the test circuit to drive the test circuit;

applying signals of opposite levels to the third and the fourth external input terminal, respectively;

selecting at least one of the plurality of word lines; and writing data in the plurality of memory cells connected to the at least one of the plurality of word lines in accordance with a test mode external input signal.

The step of selecting at least one of the plurality of word lines may comprise the step of selecting all of the plurality of word lines.

Alternatively, the method may further comprise the steps of:

selecting at least one of the plurality of word lines in units of the plurality of memory cell array blocks; and writing data in the plurality of memory cells connected to the at least one of the plurality of word line in accordance with a test mode external input signal.

Also, the method may further comprise the steps of:

stopping the sense amplifier circuit and the column selection gate in accordance with a test mode external input signal; and writing data in the plurality of memory cells connected to the at least one of the plurality of word lines in accordance with the test mode external input signal.

As described above, the ferroelectric memory of the present invention has a memory cell screening test circuit connected to bit lines through switching transistors. In screening, at least one word line is selected, and data is simultaneously written in all memory cells connected to this word line. Since data is not restored after the rewrite, all FRAM cells can be screened under the same condition. By this circuit, a memory cell having a write failure according to the imprint characteristics inherent to the ferroelectric memory is screened. When screening is properly performed, a more reliable ferroelectric memory can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A and 6B are views for explaining the write state in which FIG. 6A shows the write of data of level "1", and FIG. 6B shows the write of data of level "0";

DETAILED DESCRIPTION OF THE INVENTION

The embodiment of the present invention will be described below with reference to the accompanying drawings.

Figure 1:
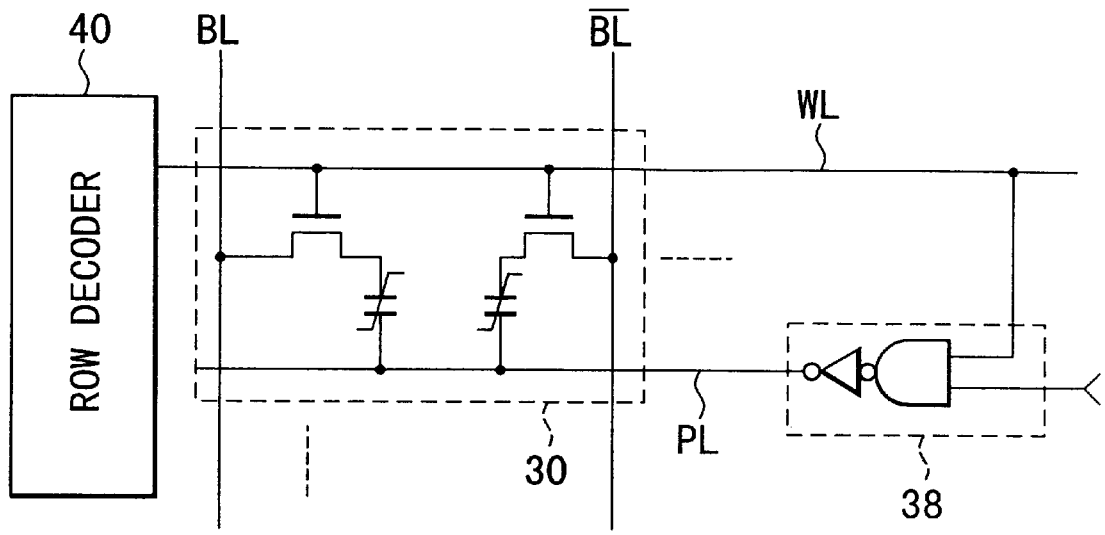
FIG. 1 is a block diagram showing part of the arrangement of a conventional FRAM cell and a peripheral circuit.
Figure 3:
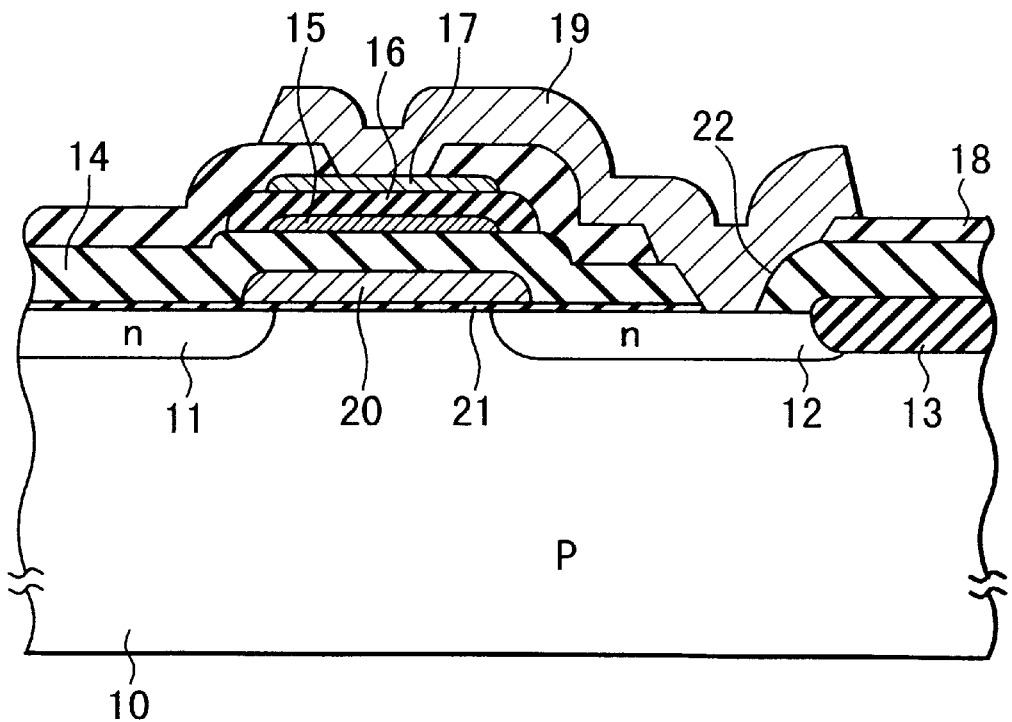
FIG. 3 is a sectional view of the memory cell of the present invention.
Figure 2:
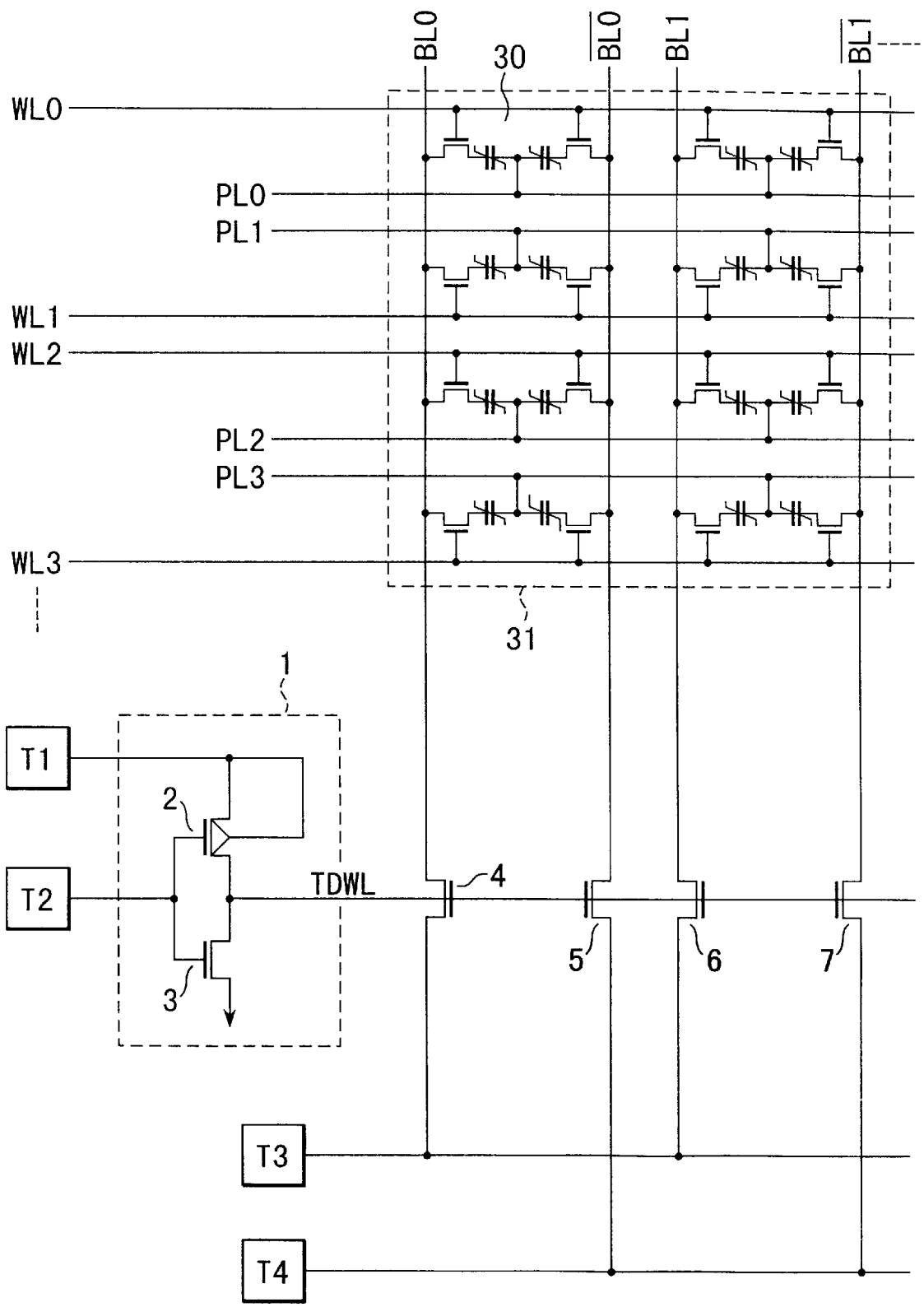
FIG. 2 is a circuit diagram of ferroelectric memory cells (FRAM cells) of the present invention and a test circuit belonging to the memory cells.

FIG. 2 is a circuit diagram of a ferroelectric memory of the present invention. FIG. 3 is a sectional view of a memory cell portion.

Referring to FIG. 3, an element isolation insulating film 13 made of a silicon oxide film is formed on the surface of a p-type silicon substrate 10. A MOS transistor is formed in the region defined by the element isolation insulating film 13. The MOS transistor comprises source/drain regions 11 and 12 formed from n-type diffusion regions, a gate insulating film 21, a gate electrode 20 of polysilicon, and the like. The gate electrode 20 extending in a direction perpendicular to the sheet surface of the figure serves as a word line (WL).

An interlayer insulating film 14 of silicon oxide ($SiO_2$) is formed on the MOS transistor. A contact hole 22 reaching the source region 12 is formed in the interlayer insulating film 14.

A ferroelectric capacitor is formed on the interlayer insulating film 14. The ferroelectric capacitor comprises a lower electrode 15, a ferroelectric film 16 formed from a PZT film or the like, and an upper electrode 17. The lower electrode 15 is a plate electrode extending in the direction perpendicular to the sheet surface of the figure to serve as a plate line.

This ferroelectric capacitor is covered with an interlayer insulating film 18 formed from a silicon oxide film. The upper electrode 17 on the ferroelectric capacitor and the source region 12 are electrically connected with an interconnection 19 of aluminum or the like through the contact hole of the interlayer insulating film 18 and the contact hole 22 of the interlayer insulating film 14.

Figure 4:
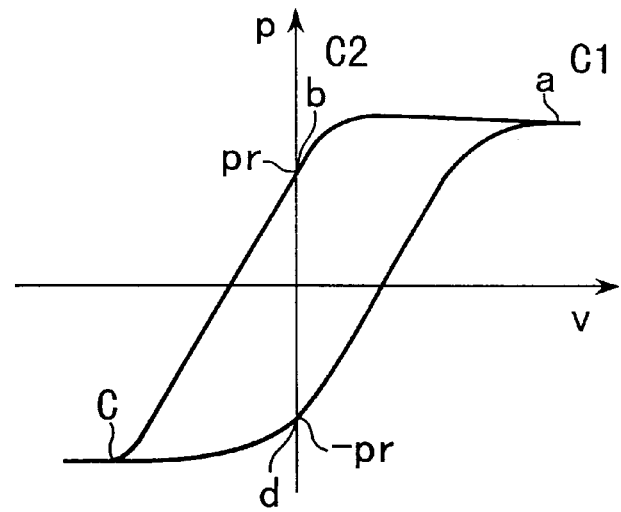
FIG. 4 is a graph showing the relationship between a voltage applied to the ferroelectric thin film and a polarization amount.

FIG. 4 is a graph showing the relationship between a voltage [V] applied to the ferroelectric thin film such as a PZT film and a polarization amount [P]. As shown in FIG. 4, the ferroelectric thin film has a hysteresis characteristics. Data can be stored in correspondence with remnant polarization Pr, positive or negative, when no voltage is applied, i.e., V=0 (V).

Figure 5:
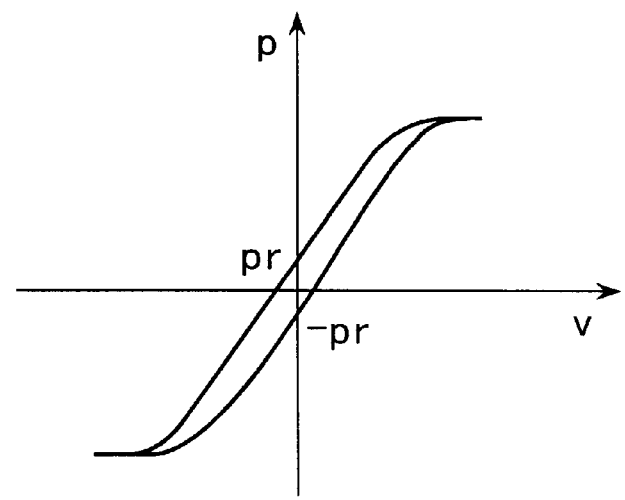
FIG. 5 is a graph showing the hysteresis characteristics of the FRAM cell in an undesirable state.

FIG. 5 is a graph showing undesirable hysteresis characteristics for the ferroelectric memory cell of the nonvolatile ferroelectric memory. Since the remnant polarization Pr is very small, the read margin by a sense amplifier lowers consequently, or data is easily lost due to external disturbance.

The write operation of the memory cell (to be referred to as an FRAM cell hereinafter) using the ferroelectric thin film will be described next with reference to FIGS. 6A, 6B, and 7.

In the nonvolatile ferroelectric memory using FRAM cells, one FRAM cell is constituted by, e.g., two MOS transistors Q1 and Q2 and two ferroelectric capacitors C1 and C2. The state shown in FIG. 6A: upward polarization (to be referred to as positive polarization hereinafter) occurs in the capacitor C1 as indicated by the upward arrow while downward polarization (to be referred to as negative polarization hereinafter) occurs in the capacitor C2 as indicated by the downward arrow is defined as "1". The state shown in FIG. 6B: negative polarization occurs in the capacitor C1 while positive polarization occurs in the capacitor C2 is defined as "0".

("1" Write Operation)

The steps of writing data of level "1" in the FRAM cell will be described below.

A voltage of 5V is applied to a bit line BL, and a voltage of 0V is applied to a complementary bit line $\overline{BL}$ (represents an inverted signal). A voltage of 7V is applied to the word line WL, and a voltage of 0V is applied to a plate line PL. In this state, the capacitor C1 is set in the state "a" shown in FIG. 4, while the capacitor C2 is set in the state "d" in FIG. 4. FIG. 7 shows a change in the potential (VPL) of the plate line PL in the write.

Figure 6A:
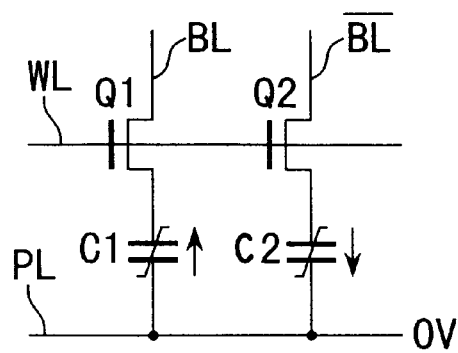

The state shown in FIG. 6A is obtained, i.e., positive polarization occurs in the capacitor C1, and negative polarization occurs in the capacitor C2, thus realizing the write of data of level "1".

("0" Write Operation)

The steps of writing data of level "0" in the FRAM cell will be described below.

A voltage of 0V is applied to the bit line BL, and a voltage of 5V is applied to the complementary bit line $\overline{BL}$. A voltage of 7V is applied to the word line WL, and a voltage of 0V is applied to the plate line PL. In this state, the capacitor C1 is set in the state "b" in FIG. 4 while the capacitor C2 is set in the state "a" in FIG. 4.

Next, the plate line PL is set at 5V. As a result, the capacitor C1 is set in the state "c" in FIG. 4 while the capacitor C2 is set in the state "b" in FIG. 4.

Subsequently, the plate line PL is set at 0V. The capacitor C1 is set in the state "d" in FIG. 4 while the capacitor C2 is set in the state "a" in FIG. 4.

Figure 6B:
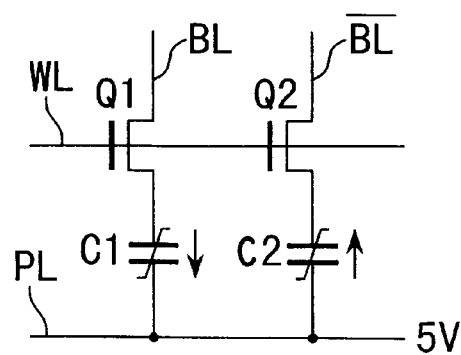

The state shown in FIG. 6B is obtained, i.e., negative polarization occurs in the capacitor C1, and positive polarization occurs in the capacitor C2, thus realizing the write of data of level "0".

The above-described nonvolatile ferroelectric memory is used for a no-power ID device or the like because of its low power consumption. The no-power ID device receives an external radio wave and uses, as power, a DC voltage obtained by rectifying the radio wave. The no-power ID device also receives and detects a signal (information) carried in the radio wave to acquire external data. Normally, the no-power ID device also has a radio transmission circuit and outputs a response signal (information).

With the above arrangement, the power supply for an ID card can be omitted, and information can be received/transmitted from/to an external master unit in a non-contact state. Such a no-power ID card is expected to be applied to a license, a commodity tag, an identification, a pass, a skiing lift ticket, or the like.

Figure 8:
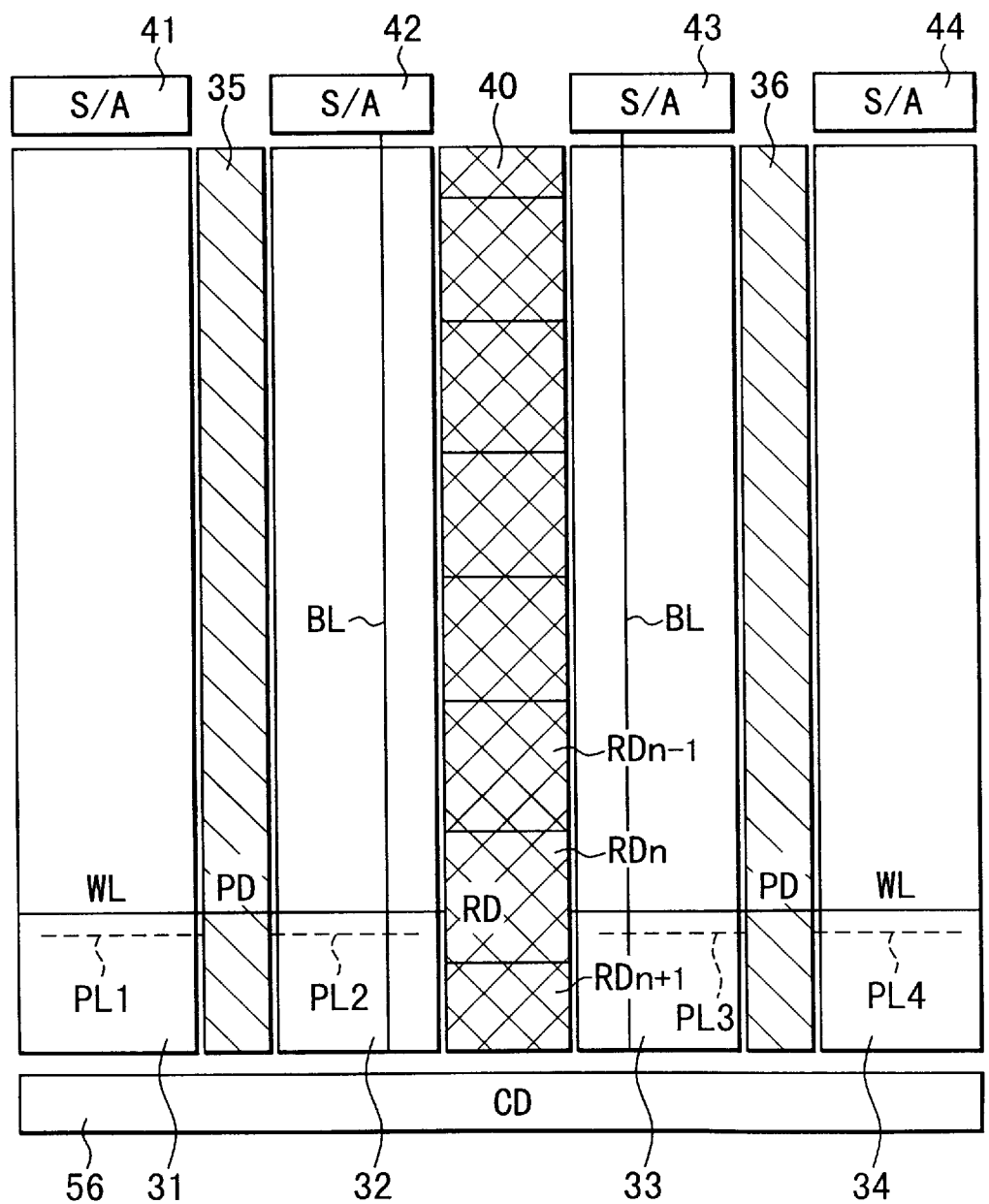
FIG. 8 is a schematic plan view showing the basic arrangement of FRAM cell arrays of the present invention and a peripheral circuit.
Figure 9:
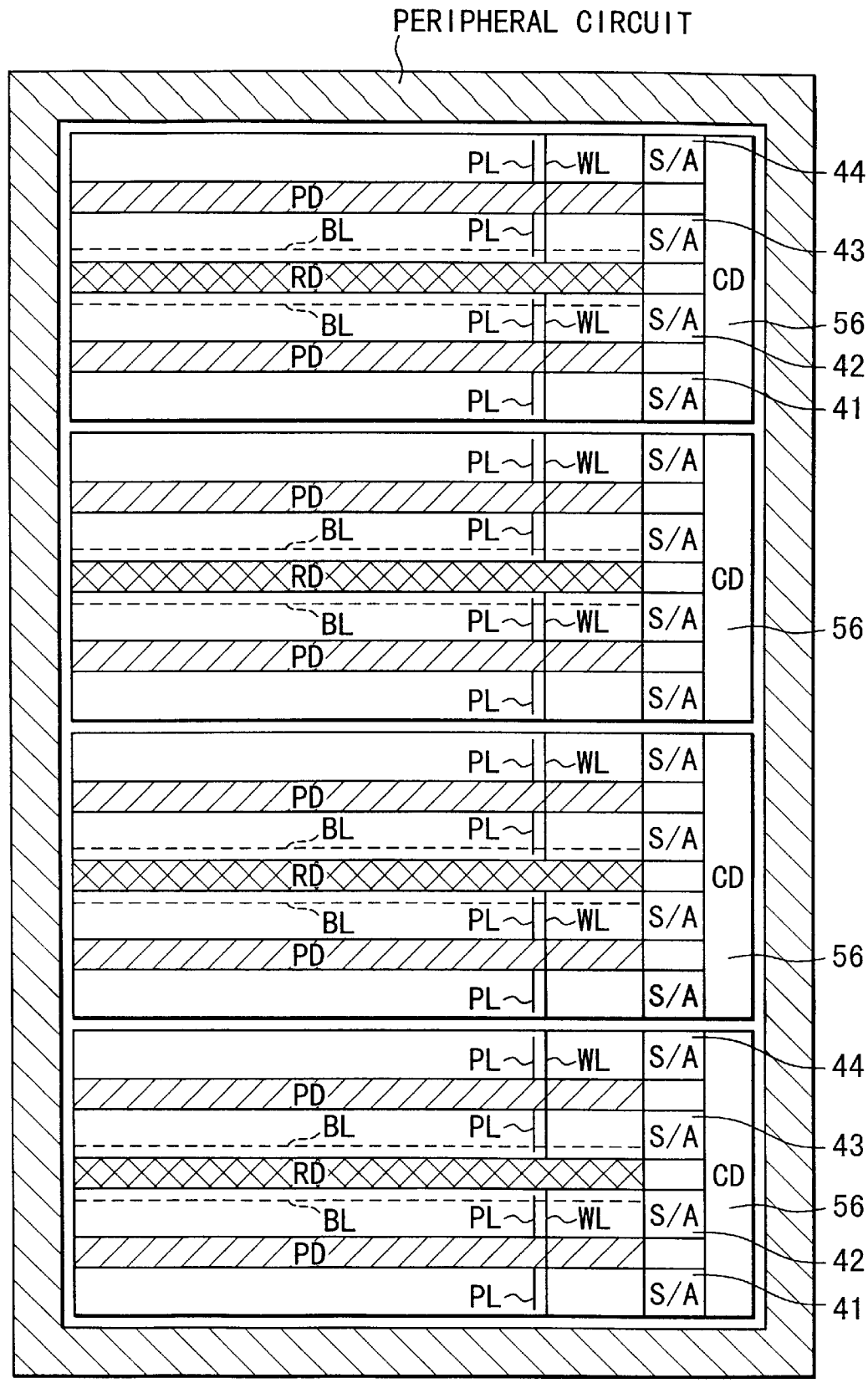
FIG. 9 is a schematic plan view showing the overall arrangement of FRAM cell arrays of the present invention and a peripheral circuit.

FIGS. 8 and 9 show the arrangement of FRAM cell arrays of the nonvolatile ferroelectric memory and a peripheral circuit. FRAM cell arrays 31 to 34 are arranged to be parallel to each other. A word line selection circuit (row decoder RD) 40 is shared by these FRAM cell arrays. When the plurality of FRAM cell arrays 31 to 34 are roughly divided into two blocks, the row decoder 40 is placed at the central portion, and a plurality of word lines WL are connected to the row decoder 40.

The FRAM cell arrays separated to the left and right sides are further divided. Plate line selection circuits (plate decoders PD) 35 are arranged for the blocks. The plate lines PL (PL1 to PL4) extend from the plate decoders 35 and 36.

One of the word line WL is selected by the row decoder 40 in accordance with a row address signal externally input.

Figure 7:
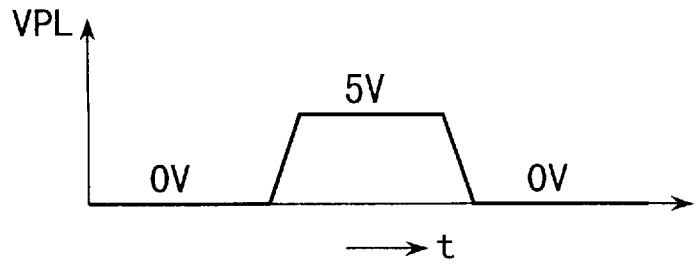
FIG. 7 is a graph showing a change in potential of a plate electrode in the write in the FRAM cell.

The plate lines PL are divisionally arranged for the FRAM cells and driven by the plate decoders 35 and 36 in accordance with a signal waveform as shown in FIG. 7.

The arrangement of the remaining parts is almost the same as that of a general-purpose DRAM. More specifically, sense amplifier circuits SA 41 to 44 are arranged for the FRAM cell arrays, respectively, to amplify a small potential difference generated on a bit line in the read.

The following circuits are not illustrated and will be described in association with FIG. 13. A column gate circuit selectively connects a data line to a bit line on the basis of a signal from a column selection line. A column decoder (CD) 56 selects a column selection line in correspondence with a column address signal externally input. A data line sense amplifier circuit amplifies data on a data line.

In this embodiment, the memory cell array is divided into four blocks (FIG. 9). Each block is further divided into four subblocks, and each subblock has a plate line (FIG. 8). The number of divided blocks is not limited to this and can be arbitrarily set. However, the memory cell array is preferably divided into an even number of blocks.

Figure 10:
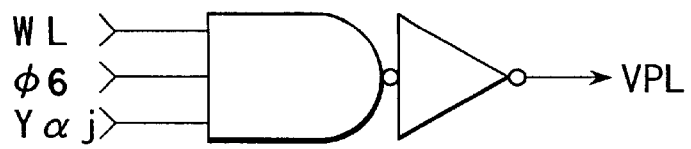
FIG. 10 is a circuit diagram of a plate decoder used in the present invention.

The circuit shown in FIG. 10 is a plate decoder according to the present invention. The plate decoder comprises a NAND circuit and an inverter for receiving the output signal from the NAND circuit. The inverter outputs a power supply voltage (VCC) as the plate voltage (VPL).

Figure 11:
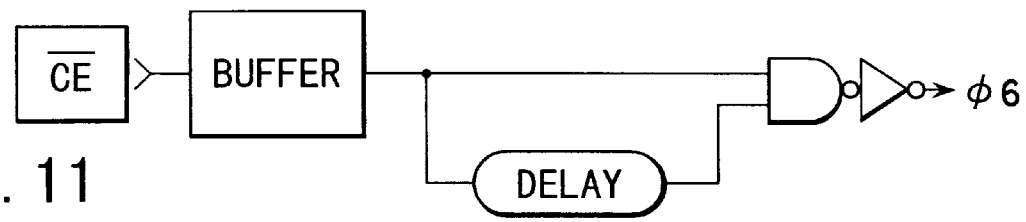
FIG. 11 is a circuit diagram of a circuit for forming an input signal to the plate decoder used in the present invention.

A Φ6 signal as one of input signals to the NAND circuit is a pulse signal obtained by delaying a $\overline{CE}$ (Chip Enable) (corresponding to $\overline{RAS}$ of a DRAM) signal, as shown in FIG. 11.

Figure 12:
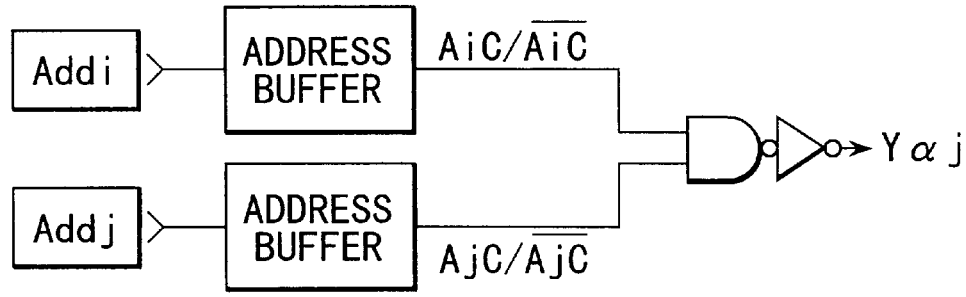
FIG. 12 is a circuit diagram of the circuit for forming the input signal to the plate decoder used in the present invention.

A Yα signal is a plate line selection signal generated using part of a column address signal and contains data for selecting one of the four plate lines divided in the row direction. For example, as shown in FIG. 12, from arbitrary two column addresses Addi and Addj, two sets of complementary signals (four signals), Aic and $\overline{Aic}$ and Ajc and $\overline{Ajc}$, are generated by address buffers. ANDs of the four combinations of the two sets of complementary signals are calculated, so that one of the four plate line address signals is output. In FIG. 12, this process is schematically expressed for the illustrative convenience. More specifically, selection is performed in the following manner.

On the basis of the output two sets of complementary signals, four combinations (Aic, Ajc), (Aic, $\overline{Ajc}$), ($\overline{Aic}$, Ajc), ($\overline{Aic}$, $\overline{Ajc}$) are prepared. When two signals of each combination are ANDed, only one combination goes "H" in accordance with the "H" and "L" levels of the signals Aic and Ajc. The combination of "H" level is input to the plate decoder shown in FIG. 10 as the Yαj signal.

The WL input signal shown in FIG. 10 represents a word line corresponding to the plate line.

In the FRAM cell array shown in FIGS. 8 and 9, the four divided plate lines PL are arranged for one word line WL. Therefore, as shown in FIG. 10, by ANDing the WL, Φ6, and Yαj signals, the potential VPL is output to one of the four plate lines, which is selected by the address signal Yαj. Since the parasitic capacitance of the plate line decreases to at least ¼ that of the conventional plate line, plate line decoding can be quickly performed, and any erroneous operation can be prevented.

A test circuit arranged in the ferroelectric memory of the present invention to be used for cell screening will be described next with reference to FIG. 2. In FIG. 2, reference numeral 1 denotes an equivalent circuit of the test circuit connected to the ferroelectric memory.

FIG. 2 shows details of part of the FRAM cell array shown in FIGS. 8 and 9. An FRAM cell array 31 includes the FRAM cells 30 arrayed in rows and columns. FRAM cells arranged on the same row are connected to the same bit line pair (BLn; $\overline{BLn}$) (n=1, 2, . . . ) FRAM cells arranged on the same column are connected to the same word line WLn (n=1, 2, . . . ) and plate line PLn (n=1, 2, . . . ) The FRAM cell 30 is equivalent to that shown in FIG. 6A or 6B and comprises two pairs of ferroelectric capacitors and NMOS transistors, which are connected in series.

Each of bit lines BL0, $\overline{BLn}$, BL1, $\overline{BL1}$, . . . is connected to one of the source and drain electrodes of a corresponding NMOS transistor, and word lines WL0, $\overline{BLn}$, WL1, $\overline{BLn}$, . . . are connected to gate electrodes. Each plate line PL is connected to one of the electrodes (the lower electrode 15 shown in FIG. 3) of the ferroelectric capacitor.

To one end of each of the bit lines BL0, $\overline{BLn}$, BL1, $\overline{BL1}$, . . . , one of the source and drain electrodes of a corresponding one of bit line selection NMOS transistors 4, 5, 6, 7, . . . is connected. The gate electrodes of these transistors are commonly connected to the output line (to be referred to as a test dummy word line TDWL hereinafter) of the test circuit 1.

The ferroelectric memory of the present invention also has four test pads T1 to T4. The test circuit 1 is constituted by a PMOS transistor 2 having a source electrode and a backgate electrode, which are connected to each other, and an NMOS transistor 3 having a drain electrode connected to the drain electrode of the PMOS transistor 2, a source electrode connected to the ground potential, and a gate electrode connected to the gate electrode of the PMOS transistor 2.

The first test pad (external input terminal) T1 is electrically connected to the source electrode and the backgate electrode of the PMOS transistor 2. The second test pad T2 is electrically connected to the gate electrodes of the PMOS transistor 2 and the NMOS transistor 3. The third test pad T3 is connected to the other of the source and drain electrodes, not connected to the bit line, of each of the NMOS transistors 4, 6, . . . , each of which is connected to one end of a corresponding one of the bit lines BL0, BL1, . . . . The fourth test pad T4 is connected to the other of the source and drain electrodes, not connected to the complementary bit line, of each of the NMOS transistors 4, 6, . . . , each of which is connected to one end of a corresponding one of the complementary bit lines $\overline{BL0}$, $\overline{BL1}$, . . .

As described above, four test pads are arranged to realize test of the present invention. The first pad T1 is set at "HV" level (level higher than Vcc), the second test pad T2 is set at "L" level, and the third and fourth test pads T3 and T4 are set at "L" and "H" levels or vice versa, respectively. In this case, the test dummy word line TDWL is set at "HV" level, so the output signal TDWL from the test circuit 1 turns on the MOS transistors 4 to 7. As a result, the potentials of the third and fourth test pads T3 and T4 are applied to the bit lines BL0, $\overline{BL0}$, BL1, $\overline{BL1}$, . . . and written in the memory cells. After this, the written data is read out, and it is determined whether the data is properly written, thereby performing cell screening.

In the test mode, all word lines are selected, and data is written in all FRAM cells. At this time, since the operation of the sense amplifier circuit or CSL (Column Select Line) may influence on the screening test conditions, these circuits must be stopped in the test mode.

Figure 13:
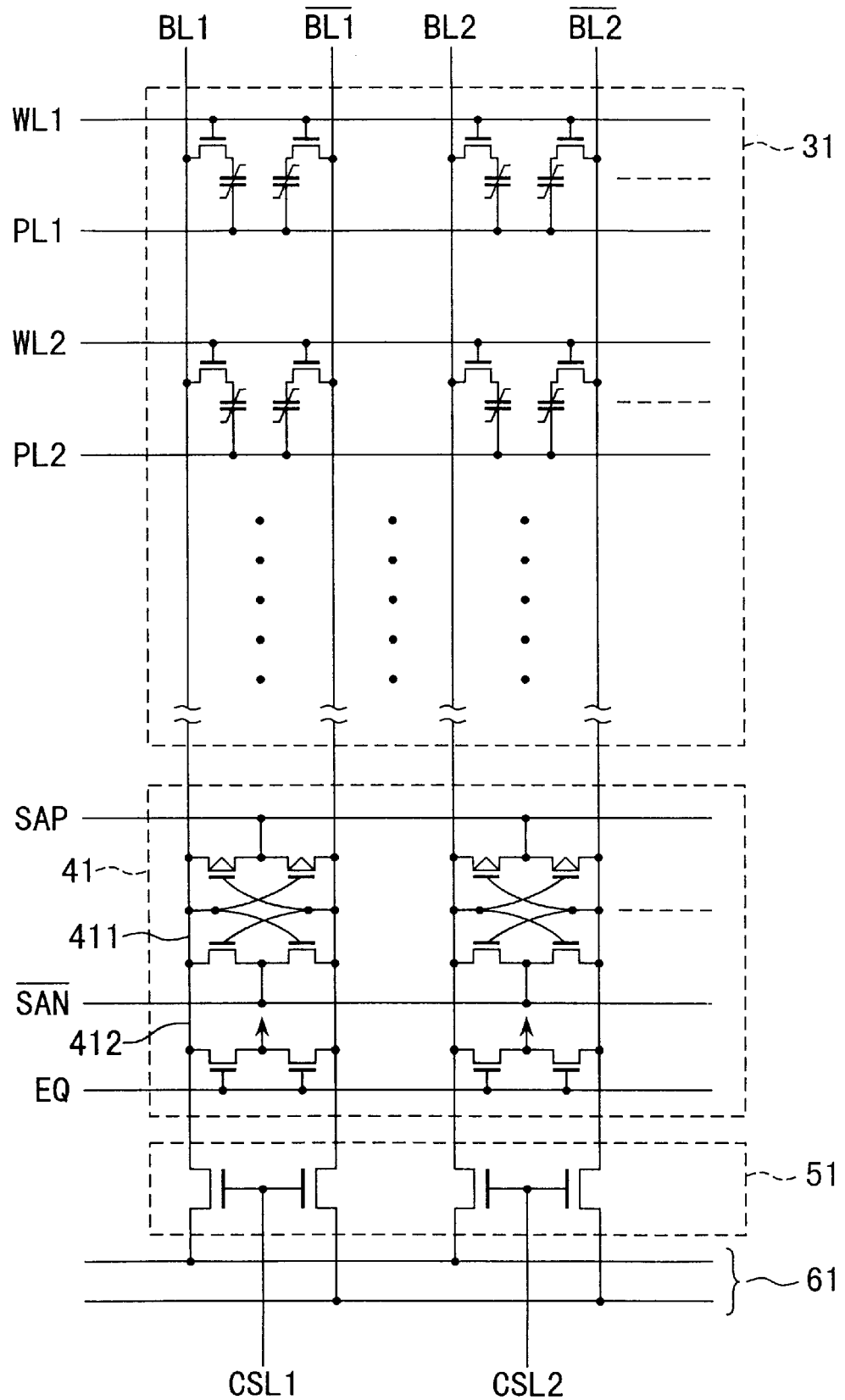
FIG. 13 is a circuit diagram showing the connection between the FRAM cell array of the present invention and the peripheral circuit such as a sense amplifier.

FIG. 13 shows details of the sense amplifier used in the FRAM cell array. FIG. 13 is a circuit diagram showing the arrangement of the FRAM cell array and the peripheral circuit. Details of the FRAM cell array 31, the sense amplifier circuit 41, and a column gate circuit 51 are shown in FIG. 13.

The sense amplifier circuit 41 comprises a plurality of sense amplifier circuits 411. Each sense amplifier has two PMOS transistors cross-connected and two NMOS transistors cross-connected. The sense amplifier 411 is driven and controlled by a p-type sense amplifier driving line SAP and an n-type sense amplifier driving line $\overline{SAN}$.

An equalizing circuit 412 comprising two NMOS transistors is connected to each bit pair to be controlled by an equalizing selection line EQ. The column gate circuit 51 is constituted by column gates connected to the bit lines. Each column gate comprises two MOS transistors. These MOS transistors are selectively driven by column selection lines CSL1 and CSL2. One data of each column gate is connected to a date line 61.

Figure 14A:
FIGS. 14A to 14C are circuit diagrams of test mode selection circuits used in the present invention.
Figure 14B:
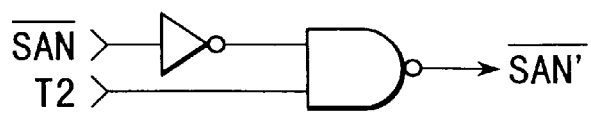
Figure 14C:

FIGS. 14A to 14C show test mode selection circuits which are stopped when the above-described sense amplifier circuit and CLS are set in the test mode. In the test mode, the signals $\overline{SAN}$ and SAP for driving the sense amplifier are stopped at the second test pad T2, and a CENB (Column Enable) signal for driving the CSL is disabled at the second test pad T2.

Figure 15:
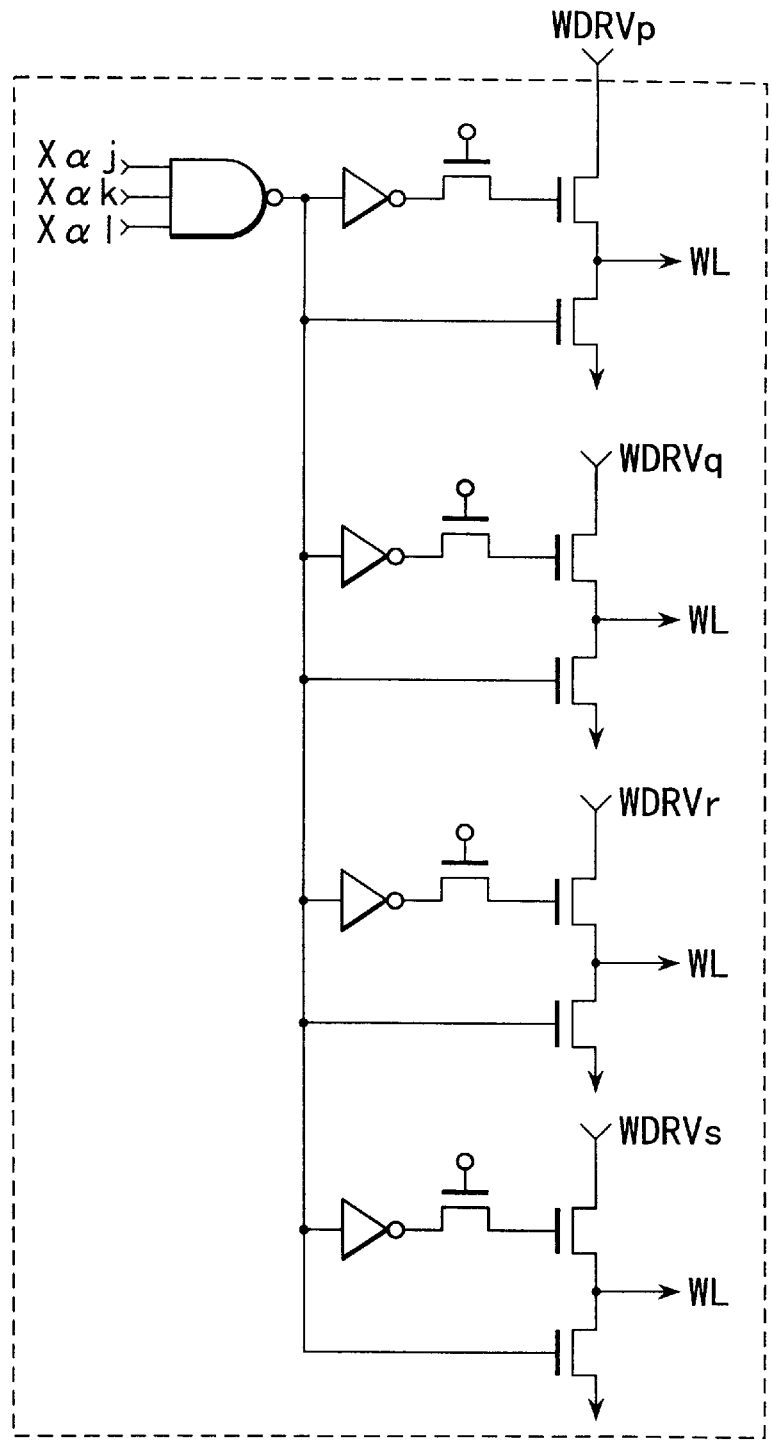
FIG. 15 is a circuit diagram of a row decoder used in the present invention.

FIG. 15 is a circuit diagram showing details of the row decoder RD shown in FIGS. 8 and 9. The row decoder is a circuit for selecting a word line. In this embodiment, the row decoder is divided into a plurality of sets each corresponding to four word lines ($RD_{(n-1)}$, $RD_n$, $RD_{(n+1)}$, . . . in FIG. 8). One set of decoders in which all signals Xαj, Xαk, and Xαl obtained by predecoding arbitrary row addresses j, k, and l go high is selected. As described above, four word lines are connected to one set of decoders, and one of the word lines is selected in accordance with signals WDRVp to WDRVs.

Figure 16:
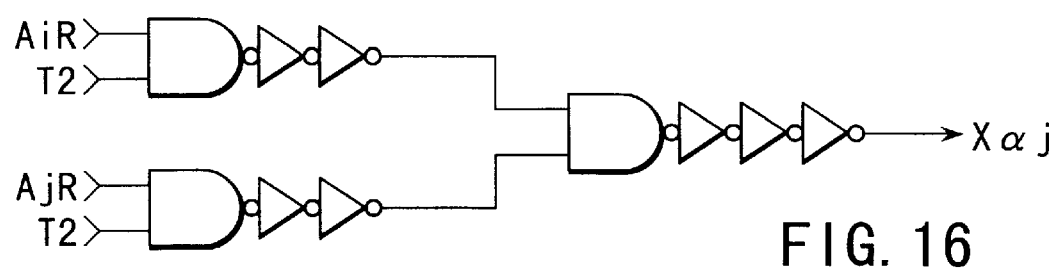
FIG. 16 is a circuit diagram of a row decoder selection circuit used in the present invention.

To select all word lines, all row decoders are set in the selected state. FIG. 16 shows a row decoder selection circuit used therefor. In use of this circuit, when the signal T2 for setting the test mode goes low, any address Xαj is set at "H" independently of input addresses AiR and AjR, or the sets of row decoders are selected.

A word line may be selected in units of chips, or, all word lines in the four cell array blocks shown in FIG. 9 may be selected. Alternatively, all word lines in each of the four cell array blocks may be sequentially selected one by one in units of cell array block units. The test circuit and the first to fourth test pads shown in FIG. 2 can be shared by all cell array blocks or arranged in units of cell array blocks. The arrangement is set in accordance with the unit of word lines (units of chips or units of cell array blocks) of word lines to be simultaneously selected in the test mode.

As described above, in the present invention, the test circuit for cell screening, which is arranged in the chip, is used to simultaneously operate all memory cells connected to at least one word line, thereby screening the write failure associated with the imprint characteristics inherent to the ferroelectric memory in a short time. According to this method, data can be effectively prevented from being restored after the rewrite, so all FRAM cells can be screened under the same condition.

In the above embodiment of the present invention, a PZT ferroelectric film has been described. However, the present invention is not limited to this and can also be applied to, e.g., a $BaTiO_3$ (BTO) film. The present invention can also be applied to a PLZT film, $LiNbO_3$ film, or $K_3Li_2Nb_5O_{15}$ film.

The process of manufacturing a ferroelectric thin film will be described next. To manufacture a ferroelectric thin film, the Sol Gel process, sputtering, or MOCVD is used. The Sol Gel process or sputtering can obtain a conspicuous effect in combination with the present invention.

In the Sol Gel process or MOD, a solution prepared using an organic metal compound or the like as a source material is applied to a substrate by dipping or spin coating and thermally decomposed to obtain a ferroelectric thin film. With this process, the film can be formed even in the air, and a large-area film can be easily obtained.

In sputtering, a gas (e.g., Ar gas) ionized in a glow discharge is collided against the target material of the thin film to generate particles, and the particles are deposited on the substrate. With this process, a film of a refractory material, which can hardly be formed by vacuum deposition, can be formed. As this film forming method, DC sputtering, high-frequency (RF) sputtering, magnetron sputtering, ion beam sputtering, reactive sputtering, or laser ablation can be used. As the target, a sintered body or particles are used and sputtered by argon in an oxygen atmosphere. When a magnet is placed near the target, sputtered ions are captured by the magnetic field. Since sputtering at a low gas pressure (up to $10^{-4}$ Torr) is allowed, the film forming speed can be increased to several times.

The microstructure and characteristics of the ferroelectric film depend on the sputtering conditions (sputtering voltage, gas composition and gas pressure, film forming speed, substrate material, and substrate temperature).

As the basic process of CVD, a compound of the element as the material of the thin film, which can be gasified, is introduced into a high-temperature furnace and deposited on the substrate surface, thereby forming a film. Since the film is formed on the substrate surface in the equilibrium state, a more uniform crystalline film can be obtained. In MOCVD, an organic metal such as acetylacetonato or alkoxide is used as a material to form a ferroelectric film.

The present invention can be applied not only to form the FRAM cells on a semiconductor substrate as described above but also to form FRAM cells on a semiconductor layer on an insulating substrate such as SOI.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric memory comprising:

a memory cell array in which a plurality of memory cells are arrayed in rows and columns, each of the plurality of memory cells including an information storage capacitor and a first MOS transistor, which is connected to the information storage capacitor in series, the information storage capacitor having a first and a second electrode opposing each other and a ferroelectric film sandwiched by the first and the second electrode, the first MOS transistor having first source and drain regions and a first gate electrode, and one of the first source and drain regions being connected to the first electrode of the capacitor;

a plurality of word lines arrayed in correspondence with the rows, each of the plurality of word lines being connected to the first gate electrode of the first MOS transistor of each of the plurality of memory cells arrayed on a corresponding one of the rows;

a row decoder for selectively driving the plurality of word lines;

a plurality of plate lines, each of the plate lines being connected to the second electrode of the capacitor of each of the plurality of memory cells arrayed on a corresponding one of the rows;

a plurality of bit lines arrayed in correspondence with the columns and arranged to cross the plurality of word lines, each of the plurality of bit lines being connected to the other of the first source and drain regions of the first MOS transistor of each of the plurality of memory cells arrayed on a corresponding one of the columns;

a plurality of second MOS transistors for bit line selection, which are coupled to the plurality of bit lines, respectively, each of the second MOS transistors having second source and drain regions and a second gate electrode, and one of the second source and drain regions being connected to a corresponding one of the plurality of bit lines; and a test circuit connected to the second gate electrode of each of the plurality of second MOS transistors, the test circuit transferring data to the plurality of memory cells through the plurality of bit lines and the plurality of second MOS transistors.

2. The ferroelectric memory according to claim 1, wherein the test circuit for screening the plurality of memory cells comprises a third p-channel type MOS transistor having third source and drain regions, a third gate electrode, and a backgate electrode, a fourth n-channel type MOS transistor having fourth source and drain regions and a fourth gate electrode, and a first and a second external input terminal, one of the third source and drain regions and the backgate electrode are connected to the first external input terminal, the third gate electrode is connected to the second external input terminal, and the other of the third source and drain regions is connected to the second gate electrode of each of the plurality of second transistors, one of the fourth source and drain regions is connected to a ground potential, the fourth electrode is connected to the second external input terminal, and the other of the fourth source and drain regions is connected to the second gate electrode of each of the plurality of second transistors, and the plurality of bit lines form a plurality of bit line pairs each comprising a bit line and a complementary bit line, the bit line and the complementary bit line being connected to a third and a fourth external input terminal for test through corresponding ones of the plurality of second transistors for bit line selection, respectively.

3. The ferroelectric memory according to claim 2, wherein a plurality of corresponding plate lines of the plurality of plate lines are arranged for each of the plurality of word lines.

4. The ferroelectric memory according to claim 3, further comprising a plate line decoder having operation of decoding a selection signal for the row decoder and a column address and selectively driving one of the plurality of corresponding plate lines.

5. The ferroelectric memory according to claim 2, wherein the memory cell array is divided into a plurality of blocks, each of the plurality of blocks having the row decoder to selectively drive the plurality of word lines.

6. The ferroelectric memory according to claim 5, wherein a plurality of corresponding plate lines of the plurality of plate lines are arranged for each of the plurality of word lines contained in each of the plurality of blocks.

7. The ferroelectric memory according to claim 6, further comprising a plate line decoder for each of the blocks, the plate line decoder having operation of decoding a selection signal for the row decoder for each of the blocks and a column address to selectively drive one of the plurality of plate lines.

8. The ferroelectric memory according to claim 2, further comprising a sense amplifier and a column selection gate connected to each of the plurality of bit line pairs, and a test mode selection circuit connected to the first external input terminal of the test circuit, the test mode selection circuit having operation of stopping functions of the sense amplifier and the column selection gate in a test mode.

9. The ferroelectric memory according to claim 2, wherein the row decoder is divided into a plurality of row decoder blocks, and the memory further comprises a row decoder block selection circuit for selectively driving the plurality of row decoder blocks.

10. The ferroelectric memory according to claim 9, wherein the row decoder selection circuit has operation of selecting all of the plurality of row decoder blocks in the test mode.

11. A method of screening the ferroelectric memory of claim 2, comprising the steps of:
   supplying signals to the first and the second external input terminal of the test circuit to drive the test circuit;
   applying signals of opposite levels to the third and the fourth external input terminal, respectively;
   selecting at least one of the plurality of word lines; and
   writing data in the plurality of memory cells connected to the at least one of the plurality of word lines in accordance with a test mode external input signal.

12. A method according to claim 11, wherein the step of selecting at least one of the plurality of word lines comprises the step of selecting all of the plurality of word lines.

13. A method of screening said ferroelectric memory of claim 5, comprising the steps of:
   supplying signals to the first and the second external input terminal of the test circuit to drive the test circuit;
   applying signals of opposite levels to the third and the fourth external input terminal, respectively;
   selecting at least one of the plurality of word lines in units of the plurality of memory cell array blocks; and
   writing data in the plurality of memory cells connected to the at least one of the plurality of word lines in accordance with a test mode external input signal.

14. A method of screening said ferroelectric memory of claim 8, comprising the steps of:
   supplying signals to the first and the second external input terminal of said test circuit to drive the test circuit;
   applying signals of opposite levels to the third and the fourth external input terminal, respectively;
   selecting at least one of the plurality of word lines;
   stopping the sense amplifier circuit and the column selection gate in accordance with a test mode external input signal; and
   writing data in the plurality of memory cells connected to the at least one of the plurality of word lines in accordance with the test mode external input signal.

15. A ferroelectric memory comprising:
   a plurality of memory cells, each of the memory cells having a first transistor and a ferroelectric capacitor, the ferroelectric capacitor having a first electrode, a second electrode and a ferroelectric film interposed between the first and the second electrode, each of the first transistor having a first gate electrode and a first current path, one end of the first current path being connected to the first electrode of the ferroelectric capacitor;
   a plurality of bit lines, each connected to the other end of the first current path of the first transistor in a corresponding one of the plurality of memory cells;
   a plurality of word lines, each connected to the first gate electrode of the first transistor in a corresponding one of the plurality of memory cells;
   a plurality of second transistors, each having a second gate electrode and a second current path, one end of the second current path being connected to a corresponding one of the plurality of bit lines;
   a test circuit connected to the second gate electrode of each of the plurality of second transistors, the test circuit selecting the plurality of second transistors in a test mode; and
   a pad receiving data and transferring the data to a corresponding one of the plurality of memory cells through a corresponding one of the plurality of second transistors and a corresponding one of the plurality of bit lines.

16. A ferroelectric memory comprising:
   a plurality of memory cells, each of the memory cells having a first transistor and a ferroelectric capacitor, the ferroelectric capacitor having a first electrode, a second electrode and a ferroelectric film interposed between the first and the second electrode, each of the first transistor having a first gate electrode and a first current path, one end of the first current path being connected to the first electrode of the ferroelectric capacitor;
   a plurality of bit lines, each connected to the other end of the first current path of the first transistor in a corresponding one of the plurality of memory cells;
   a plurality of word lines, each connected to the first gate electrode of the first transistor in a corresponding one of the plurality of memory cells;
   a plurality of second transistors, each having a second gate electrode and a second current path, one end of the second current path being connected to a corresponding one of the plurality of bit lines;
   a first pad supplied with a predetermined voltage;
   a test circuit connected to the second gate electrode of each of the plurality of second transistors, the test circuit having an inverter circuit formed of a p-channel type MOS transistor and an n-channel type MOS transistor, the p-channel MOS transistor having a source terminal and a drain terminal, the source terminal being supplied with the predetermined voltage applied to the first pad; and
   a second pad receiving data and transferring the data to a corresponding one of the plurality of memory cells through a corresponding one of the plurality of second transistors and a corresponding one of the plurality of bit lines.

17. The ferroelectric memory according to claim 16, wherein the test circuit selects the plurality of second transistors in a test mode.

18. The ferroelectric memory according to claim 16, wherein the first pad is supplied with the predetermined voltage in a test mode.

19. A ferroelectric memory comprising:
   a plurality of memory cells, each of the memory cells having a first transistor and a ferroelectric capacitor, the ferroelectric capacitor having a first electrode, a second electrode and a ferroelectric film interposed between the first and the second electrode, each of the first transistor having a first gate electrode and a first current path, one end of the first current path being connected to the first electrode of the ferroelectric capacitor;

a plurality of bit lines, each connected to the other end of the first current path of the first transistor in a corresponding one of the plurality of memory cells;

a plurality of word lines, each connected to the first gate electrode of the first transistor in a corresponding one of the plurality of memory cells;

a plurality of second transistors, each having a second gate electrode and a second current path, one end of the second current path being connected to a corresponding one of the plurality of bit lines;

a first pad supplied with a predetermined voltage;

a second pad supplied with a predetermined signal;

a signal line connected to the second gate electrode of each of the plurality of second transistors;

a test circuit having an inverter, the inverter having an input terminal, an output terminal and a power supply terminal, the power supply terminal being supplied with the predetermined voltage applied to the first pad, the output terminal of the inverter being connected to the signal line, the input terminal of the inverter circuit being supplied with the predetermined signal applied to the second pad; and a third pad receiving data and transferring the data to a corresponding one of the plurality of memory cells through a corresponding one of the plurality of second transistors and a corresponding one of the plurality of bit lines.

20. The ferroelectric memory according to claim 19, wherein the first pad is supplied with the predetermined voltage and the second pad is supplied with the predetermined signal in a test mode.

* * * * *